(12) United States Patent
Rudmann et al.

(10) Patent No.: US 9,237,264 B2
(45) Date of Patent: Jan. 12, 2016

(54) METHOD OF MANUFACTURING A PLURALITY OF OPTICAL DEVICES FOR CAMERAS

(75) Inventors: Hartmut Rudmann, Jona (CH); Peter Roentgen, Thalwil (CH); Matthias Maluck, Zug (CH); Markus Rossi, Jona (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 13/817,202

(22) PCT Filed: Aug. 12, 2011

(86) PCT No.: PCT/CH2011/000180
§ 371 (c)(1),
(2), (4) Date: May 28, 2013

(87) PCT Pub. No.: WO2012/022000
PCT Pub. Date: Feb. 23, 2012

(65) Prior Publication Data
US 2013/0242182 A1     Sep. 19, 2013

Related U.S. Application Data

(60) Provisional application No. 61/374,322, filed on Aug. 17, 2010.

(51) Int. Cl.
*H04N 5/225* (2006.01)
*G02B 7/00* (2006.01)
(Continued)

(52) U.S. Cl.
CPC .............. *H04N 5/2254* (2013.01); *G02B 7/003* (2013.01); *G02B 7/021* (2013.01); *G02B 13/006* (2013.01);
(Continued)

(58) Field of Classification Search
CPC .................. H01L 27/14625; H01L 27/14685; H01L 27/14687; H01L 27/14618; H04N 5/2254; H04N 5/2257; H04N 17/002; G06T 7/0018; G02B 13/001–13/009; G02B 7/003–7/005; G02B 7/04–7/105; H04M 1/0264; G01N 2021/9511; G01N 2021/9583
USPC .................... 348/207.99, 294, 345–347, 374; 396/89, 529; 359/656, 796; 257/432; 250/239; 29/832; 356/124–127, 239.2
See application file for complete search history.

(56) References Cited

U.S. PATENT DOCUMENTS 5,400,072 A    3/1995  Izumi et al.
(Continued)

FOREIGN PATENT DOCUMENTS

JP          3-30581      2/1991
JP       2010-103493     5/2010
(Continued)

OTHER PUBLICATIONS

European Patent Office, International Search Report for International Patent Application No. PCT/CH2011/000180 (Dec. 5, 2011).
(Continued)

*Primary Examiner* — Dennis Hogue
(74) *Attorney, Agent, or Firm* — Fish & Richardson P.C.

(57) ABSTRACT

Manufacturing optical devices (e.g., for cameras) includes providing and allocating mount elements to lens modules wherein the mount elements are to be arranged within the optical devices to define a fixed separation distance between the lens modules and the image sensor plane. The mount elements have variable mount FFL sections by means of which the geometrical distance between the lens module and the image sensor plane is adjusted for each lens module, individually or in groups dependent on the optical properties of the lens modules, to compensate the variation of the lens module values among the lens modules, so that the focal planes of the lens modules falls into the image sensor plane.

8 Claims, 4 Drawing Sheets

(51) Int. Cl.
 *H01L 27/146* (2006.01)
 *G02B 13/00* (2006.01)
 *G02B 7/02* (2006.01)

(52) U.S. Cl.
 CPC ...... *G02B 13/0085* (2013.01); *H01L 27/14618* (2013.01); *H01L 27/14625* (2013.01); *H01L 27/14685* (2013.01); *H01L 27/14687* (2013.01); *H01L 2924/0002* (2013.01); *H04N 5/2257* (2013.01); *Y10T 29/49002* (2015.01); *Y10T 29/49826* (2015.01)

(56) References Cited

U.S. PATENT DOCUMENTS

| | | | |
|---|---|---|---|
| 2004/0165823 A1 | 8/2004 | Morris et al. | |
| 2005/0077458 A1* | 4/2005 | Ma et al. | 250/239 |
| 2006/0011809 A1 | 1/2006 | Farnworth et al. | |
| 2006/0044450 A1 | 3/2006 | Wolterink et al. | |
| 2007/0070511 A1* | 3/2007 | Lee et al. | 359/656 |
| 2007/0166029 A1* | 7/2007 | Lee et al. | 396/529 |
| 2009/0217516 A1* | 9/2009 | Pawlowski et al. | 29/832 |
| 2009/0309177 A1* | 12/2009 | Jeung et al. | 257/432 |
| 2009/0321861 A1* | 12/2009 | Oliver et al. | 257/432 |
| 2010/0073534 A1 | 3/2010 | Yano et al. | |
| 2010/0117176 A1* | 5/2010 | Uekawa | 257/432 |
| 2010/0322610 A1* | 12/2010 | Lusinchi | 396/89 |
| 2011/0273600 A1* | 11/2011 | Kriman et al. | 348/294 |
| 2011/0304930 A1* | 12/2011 | Welch et al. | 359/796 |

FOREIGN PATENT DOCUMENTS

| | | |
|---|---|---|
| WO | 2009/076786 | 6/2009 |
| WO | 2010/091053 | 8/2010 |
| WO | 2011/049635 | 4/2011 |

OTHER PUBLICATIONS

Ho-Seop Jeong et al., "Camera Imaging Lens Fabrication using Wafer-Scale UV Embossing Process," J. Optical Society of Korea, vol. 10, No. 3, pp. 124-129 (Sep. 2006).

\* cited by examiner

METHOD OF MANUFACTURING A PLURALITY OF OPTICAL DEVICES FOR CAMERAS

FIELD OF THE INVENTION

The invention is in the field of digital camera devices such as CMOS or CCD cameras. It pertains to a method for manufacturing optical devices, to optical devices for such cameras and to cameras containing said optical devices.

BACKGROUND OF THE INVENTION

Cameras and particularly integrated camera optics are nowadays integrated in a large percentage of any electronic devices manufactured, including mobile phones, computers, web cams etc. It is increasingly important that such cameras can be manufactured economically, for example in a parallel process, and that they have as few parts as possible that are mechanically complicated, difficult to manufacture or delicate to handle. Especially for mobile phone applications but also for other applications, there is moreover an increasing demand for cameras that are thin, i.e. the extension in direction of the optical axis is small. Nevertheless, there is also an increasing demand on the resolution that should be achieved by such integrated cameras.

For economical reasons the components of the optical devices, for example lens modules, are often produced on a wafer-scale. A wafer or a wafer stack is thereby produced in an automated process and contains a plurality of congeneric components, as e.g. lens modules, which are individualized in a subsequent process step by separating them from the wafer or wafer stack.

The optical devices, amongst them lens modules, also contain an optoelectronic unit with an image sensor which defines an image sensor plane on which image sensor elements are arranged. Also this optoelectronic units can be manufactured on a wafer-scale as described above. This type of manufacturing processes are well known in the state of the art and e.g. described in the patent publication WO 2009/076 786.

Lens modules comprise an arrangement of one or more lenses or lens parts which serve for the guiding and distribution of the incident light on the image sensor plane of the optoelectronic unit of the camera. Such lens modules have a fix focus which is laid out to match with the distance between the lens module and the image sensor plane of the optoelectronic unit once assembled in the optical device. The fix focus is thereby defined by the flange focal length (FFL), which corresponds to the distance between the last physical plane of the lens (or rather objective) which is the last wafer plane, i.e. that one directed to the sensor in present case, and the focal plane on the side opposite to the object to be imaged, i.e. on the sensor side. Hence the flange focal length refers to a back FFL In order to achieve a high image sharpness, the focal plane and the image sensor plane have to be congruent. I.e., using fix focus lens modules in a large scale production process of optical devices for cameras all lens modules must have a constant FFL.

However, due to fabrication tolerances the lens modules of a wafer or wafer stack assembly and/or the lens modules of different wafers or wafer stack assemblies to some degree have variable FFL-values. I.e., the FFL-value of the lens modules rather follows a normal distribution as e.g. shown in FIG. 3. It is clear that lens modules with an FFL which lies off the center of this normal distribution have to be rejected as the focus plane of the lens module would lie far-off the image sensor plane. However, for an economical production of such optical devices it is essential that as few rejects occur as possible. To reduce the mentioned fabrication tolerances the production process can only be improved to a limited degree. Hence, other ways have to be found to reduce the amount of rejected components.

It is known from the state of the art that lenses are assembled into a barrel and mount and are then focused after assembly on the image sensor. This approach has the drawback of additionally assembly costs, which are caused by the focusing step. A further disadvantage is the large camera footprint since the barrel/mount solution is usually bigger. Further, this method has the risk of so-called "foreign material" on the image sensor. This, because particles of the barrel/mount could fall onto the sensor during the focusing operation.

It is also known from the state of the art to assemble a lens at a fixed focus distance, e.g. by means of a bottom spacer or a mount with a fixed height for all lenses. This method overcomes the disadvantages of the above mentioned approach but has the risk that if the lenses in a production batch have a certain distribution in their FFL's (caused by regular fabrication tolerances), many of the assembled lenses would not be in focus and hence the yield could be quite low.

DESCRIPTION OF THE INVENTION

It is an object of the present invention to provide an economical method for manufacturing a plurality of optical devices for cameras with as little rejects as possible. It is further an object of the invention to provide a plurality of optical devices for such cameras which are produced with the manufacturing method according to the invention.

These objects can be achieved in some implementations of methods and/or optical devices described in the disclosure. Further, preferred embodiments are evident from the dependent patent claims. Features of the method claims may be combined with features of the device claims and vice versa.

As already mentioned above, each optical device comprises a fix focus lens module with one or more lenses or lens parts. The fix focus lens module is for assembling with an optoelectronic unit having an image sensor with an image sensor plane.

The optoelectronic unit can be part oft the optical device according to the definition in this patent application. Sensor elements are arranged on the image sensor plane of the image sensor. The light is directed through the lens module to the image sensor plane and impinges on the sensor elements. It is therefore important that the light is correctly directed to the sensor plane. The image sensor may comprise arrays of pixel, i.e. arrays of sensing elements. The image sensor can e.g. be an Active Pixel Sensor (APS), also called CMOS-Sensor, or a CCD Sensor.

The method comprises now the following steps:
- manufacturing a plurality of lens modules;
- determining a lens module focusing parameter value for each lens module;
- providing and allocating mount elements to the lens modules, whereas the mount elements are to be arranged within the optical devices to define a fixed separation distance between the lens modules and the image sensor plane, the mount elements having variable mount section lengths by means of which the geometrical distance between the lens module and the image sensor plane is adjusted for each lens module individually or in groups dependent on the optical properties of the lens modules, to compensate the variation of the lens module focusing parameter values between the plurality of lens modules, so that the focal planes of the lens modules falls into an image plane, particularly the image sensor plane or lie within the depth of focus of the camera containing the optical device;

assembling the lens modules and the mount elements to form optical devices.

The focusing parameter is preferably a focus length, particularly the flange focus length (FFL). It can also be another parameter related to a focus length as e.g. the effective focal length (EFL). If it is referred to the FFL in the following description it can also be meant the focusing parameter in general, where appropriate.

If the focusing parameter is the FFL, the step of determining the lens module focusing parameter value can comprise the direct or indirect measuring of the FFL value or can comprise the determining of specific optical properties of the lens module, wherein these optical properties are based on the flange focal length (FFL) of the corresponding lens modules.

In a preferred embodiment of the invention the production of the lens modules further comprises the following steps:

manufacturing one or more than one wafer or a wafer stack assembly, each wafer or wafer stack assembly containing a plurality of lens modules;

separating each wafer or wafer stack assembly into individual lens modules.

The mount element has several functions as outlined below:

it carries the lens module and brings latter directly or indirectly in an operative connection with an optoelectronic unit;

it defines the position of the lens module and the optoelectronic unit relative to each other; and it compensates variable focusing parameter values, particularly FFL-values, of the lens modules in order to make sure that the focal plane of the lens module falls into the image sensor plane.

The method steps can also be carried out in a different order. However, the method steps have to be carried out in a logical order which does make sense.

The mount section length (h1, b1), particularly the mount FFL section length, of the mount element lies between a limit stop for the lens module on the mount element and the image sensor plane and defines a length section of the total distance between the limit stop on the mount element and the image sensor plane. In order to achieve that the focal plane of the lens module falls into the plane of the image sensor said total distance has now to be adjusted to the actual focusing parameter value, in particular the FFL-value, of the corresponding lens module. This happens by providing mount elements with variable mount section lengths (h1).

The variable mount section length (h1, b1) corresponds to a length section of the mount element, wherein said length section is parallel to the axis along which the optoelectronic unit and the lens module are assembled. The variable mount section length (h1, b1) of a mount element is particularly defined by the distance between a second contact surface on the mount element via which the mount element is supported, on its side facing the optoelectronic unit, on the optoelectronic unit or an assembly part, which is directly or indirectly connected to the optoelectronic unit and a first contact surface or support surface on which the lens module is supported and which forms a limit stop. Hence, the distance between the first and second contact surface defines the variable mount section length (h1, b1). The lay-out of the optical devices is preferably such that the distance between said second contact surface and the image sensor plane is the same for all optical devices.

According to a preferred further development of the invention the method further comprises the steps of:

defining at least two classes of focusing parameter values, particularly FFL-classes, each class encompassing a lens module focusing parameter value, e.g. an FFL-value, or a range of lens module focusing parameter values, e.g. a range of FFL-values, which fall within the possible distribution of lens module focusing paramter values, e.g. FFL-values, of the lens modules;

allocating each lens module to an class based on the lens module focusing parameter value, e.g. FFL-value;

providing and allocating to each class a class of mount elements with a defined mount section length (h1, b1), wherein the mount section length (h1, b1) is defined depending on the lens module focusing paramter value, e.g. the FFL-value, or the range of lens module focusing parameter values, e.g. FFL-values, of the class to which the mount elements are to be allocated;

allocating each lens module of a class a mount element allocated to this class.

The allocation of the lens module to a class can also be carried out by means of a process of elimination, wherein the classes in which the lens module does not fit are excluded until the correct class remains. The class allocation of the lens modules can also be carried out by means of a comparative method.

In a preferred embodiment of the invention the mount sections length (h1, b1) of the mount elements are graded between the classes of mount elements in defined steps, e.g. in steps of 5-15 μm, particularly of 10 μm. The steps between the classes of mount elements are preferably constant. If the spectrum of possible focusing parameter values, particularly FFL values, is divided in steps of 10 μm, 10 types of mount elements and accordingly 10 classes of FFL value ranges cover a total range of FFL values of 100 μm. As the number of lens modules lying within a defined range of FFL-values rapidly decreases with increasing distance from the center of the normal distribution, outliers which are lying far-off the center preferably are not covered by this process and furthermore rejected.

As already mentioned, the lens modules are preferably produced, i.e. replicated on a wafer-scale, wherein the lens modules preferably are based on a wafer stack assembly. The replication process can comprise process steps as molding or embossing. The publications EP-A-1 443 344, EP-A-1 837 165, EP-A-1 837 167 and WO 2009/076 786 disclose for example processes for the manufacturing, i.e. replication of lens modules.

Hence, a wafer stack assembly comprises a plurality of lens modules. The wafer stack assembly itself preferably contains a first wafer and a second wafer. On the first and second wafer a plurality of lens structures for lens modules are replicated, wherein the first wafer forms a plurality of first lens units and the second wafer forms a plurality of second lens unit. The first and second wafer are bonded and spaced apart from each other for example via a spacer wafer. I.e. the wafers are stacked above each other. The spacer wafer may have a plurality of through holes, which are aligned with the replicated lens structures, so that the light passing through the lens(es) of the first lens unit crosses the space between the first and second lens unit undisturbed. Optionally, on the object-side of the first waver a screen wafer or baffle wafer with apertures is arranged and facing to the object to be imaged. The apertures are aligned with the lenses of the lens modules of the wafer stack assembly. The screen with the apertures is provided for blocking off stray light. The screen wafer or baffle wafer, as described above, can also be applied to another wafer-design for the production of lens modules. In addition or as an alternative, for example the first wafer may comprise an non-transparent layer or a plurality of non-transparent layers, which non-transparent layers together may form a baffle, as for example described in WO 2009/076 787 incorporated herein by reference.

In a preferred further development of the invention also the optoelectronic units are manufactured on a wafer-scale, wherein a wafer or a wafer stack assembly is manufactured which contains a plurality of optoelectronic units. The wafer or wafer stack assembly is then separated into individual optoelectronic units.

The invention further comprises a plurality of optical devices for cameras manufactured according to the inventive method as described above. The lens modules of a group of optical devices have variable focusing parameter values, particularly flange focal lengths (FFL). Each optical device comprises a mount element. The mount elements have variable mount section lengths ($h_1$, $b_1$), particularly mount FFL sections, wherein the mount FFL section ($h_1$, $b_1$) of a mount element is adapted to the FFL-value of the lens module of the corresponding optical device, so that the focal plane of the lens module falls into the image sensor plane. Said lens modules are e.g. designed for cameras with identical design. For the manufacturing of the lens modules preferably identical lenses or identical groups of lenses are used to form the lens modules. However, the FFL between the lens modules can vary because of fabrication tolerances during the production of the components used in the lens module and/or because of fabrication tolerances in the lens modules.

The mount element preferably has the shape of a hollow cylindrical element, which accommodates the lens module. The mount element can have the form of a circular, elliptical or prismatic cylinder and can particularly also have the shape of a cuboid. The mount element may contain on its inside at least one protrusion or a circumferential inwardly protruding ring which forms the first contact surface for the lens module and serves as dead stop or supporting surface for the lens module, which is introduced either from the bottom or from the top (as viewed from the second contact surface of the mount element resp. from the focal plane) into said mount element. The dead stop, i.e. the first contact surface can also be formed by at least partially closed cover element on the end face of the mount element lying opposite to the second contact surface. The cover element can be opaque or transparent. The cover element can e.g. be in the form of ring-shaped protrusion facing inwards. Further, the cover element is preferably an integral part of the mount element. Hence, the first contact surface of the mentioned dead stop defines one boundary of the mount section length ($h_1$, $b_1$).

The second contact face of the mount element is designed for facing an optoelectronic unit when assembled with the optoelectronic unit and designed for supporting the mount element directly or indirectly on the optoelectronic unit. This surface is e.g. the ring shaped front end of the mount element. The mount section length ($h_1$, $b_1$) of the mount element is preferably sized such that the distance between the second contact surface of the mount element and the image sensor plane of the optoelectronic unit, the so-called device section length ($h_2$, $b_2$), particularly device FFL section, can be kept constant for all classes of mount elements when assembled with the optoelectronic unit.

The position or the design of the dead stop, particularly of the at least one protrusion, relative to said second contact surface in axial direction (D) of the mount element, i.e. the position of said first contact surface relative to said second contact surface defines now the variable mount section length of the mount element. Hence, the first contact surfaces of the mount elements for different classes of focusing parameter values, particularly FFL-values, are located at different distances relative to the second surfaces along the axial direction (D) of the hollow cylindrical mount element (which corresponds to the assembling axis), so that variable mount section lengths of the mount elements are achieved to compensate the variable focusing parameter values of the lens modules. The mount elements can e.g. be produced individually or on a wafer-scale as well. They can e.g. be produced by means of an injection moulding process. However, it is an important aspect of the present invention that the mount section length by means of which the geometrical distance between the lens module and the image plane is adjusted is either integrally produced with the mount element or in a post-processing step but always before the allocation of the mount element to a lens module and before the assembling with the lens module.

The present invention provides a "pre-focused" module for assembling into a camera resp. for assembling with an optoelectronic unit to form an optical device. Hence, no further focusing steps have to be undertaken during or after assembling into the camera or during or after assembling with the optoelectronic unit.

The invention further comprises a plurality of cameras containing optical devices as described above.

BRIEF DESCRIPTION OF THE DRAWINGS

The subject matter of the invention will be explained in more detail in the following text with reference to preferred exemplary embodiments which are illustrated in the attached drawings. The drawings schematically show.

The reference symbols used in the drawings, and their meanings, are listed in summary form in the list of reference symbols. In principle, identical parts are provided with the same reference symbols in the figures.

DETAILED DESCRIPTION OF PREFERRED EMBODIMENTS

Figure 1:
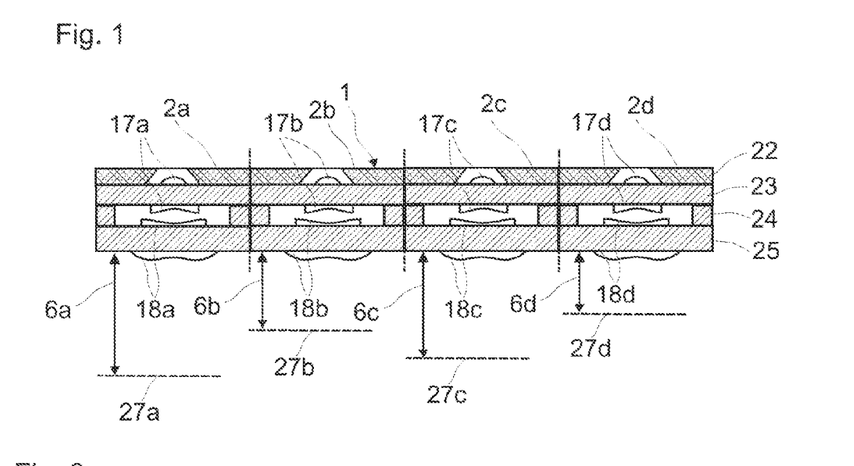
FIG. 1 a wafer stack assembly comprising a plurality of lens modules.
Figure 2:
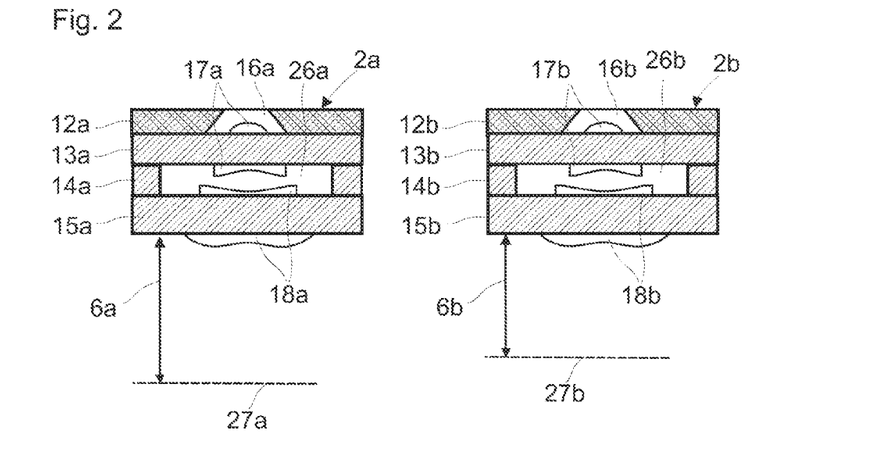
FIG. 2 separated lens module from the wafer stack assembly according to FIG. 1.

FIG. 1 schematically shows a wafer stack assembly 1 comprising a plurality of lens modules 2a . . . d. The lens modules 2a . . . d once separated in single units are also called lens chips. The build-up of the wafer stack assembly 1 comprises a first and a second wafer 23, 25, each wafer 23, 25 containing a plurality of lens structures 17a . . . d, 18a . . . d (see also FIG. 2). The lens structures 17a . . . d, 18a . . . d are e.g. made of or can contain transparent plastic, such as a transparent curable epoxy resin. They can e.g. be replicated onto the surface of the first and second wafer 23, 25. The first and second wafer 23, 25 can be made of or can contain plastic or glass. The lens structures 17a . . . b of the first wafer 23, in connection with a wafer carrier section, define first lens units 13a . . . b, one for each lens module 2a . . . b. The lens structures 18a . . . b of the second wafer 25, in connection with a wafer carrier section, define second lens units 15a . . . b, one for each lens module 2a . . . b. The first and second lens unit 13a . . . b, 15a . . . b of a lens module 2a . . . b form a lens arrangement of said lens module 2a . . . b (FIG. 2).

The first and second wafer 23, 25 are spaced apart by means of a spacer wafer 24. The spacer wafer 24 comprises a plurality of spacer elements 14a . . . b, one for each lens module 2a . . . d. The spacer wafer 24 further comprises a plurality of openings or through holes 26a . . . b, one for each spacer element 14a . . . b, i.e. for each lens module 2a . . . b. The through holes 26a . . . b are aligned with the lens arrangements of the lens modules 2a . . . d so that the light can pass through the first lens unit 13a . . . b, the through hole 26a . . . b and the second lens unit 15a . . . b. The first and second wafer 23, 25 and the spacer wafer 24 preferably are bonded together e.g. by means of an adhesive.

On the free surface of the first wafer 23, the wafer stack assembly further contains a screen wafer 22 defining a plurality of screen elements 12a . . . b, one for each lens module 2a . . . b. The screen wafer 22 contains a plurality of apertures 16a . . . b, one for each screen element 12a . . . b. The apertures 16a . . . b are aligned with the lens arrangements of the lens modules 2a . . . d, so that the incident light first enters through the aperture 16a . . . b before passing through the lens arrangement. The screen elements 12a . . . b serves for preventing undesirable stray light from entering and passing through the lens arrangement. The screen wafer 22, arranged on the first wafer 23, faces away from the image sensor plane 5. The screen wafer 22 can be bonded onto the first wafer 23, e.g. by means of an adhesive.

Of course, the wafer stack assembly 1 as shown in FIG. 1 is not the only possible wafer scale build-up to produce lens module. The lens modules can also be designed based on only one or on more than two wafers containing lens structures. In the first case no spacer wafer are necessary and in latter case more than one spacer wafer are necessary in order to space apart the wafers from one another. Further, lens structures can be provided on one or both sides of the wafers.

Figure 3:
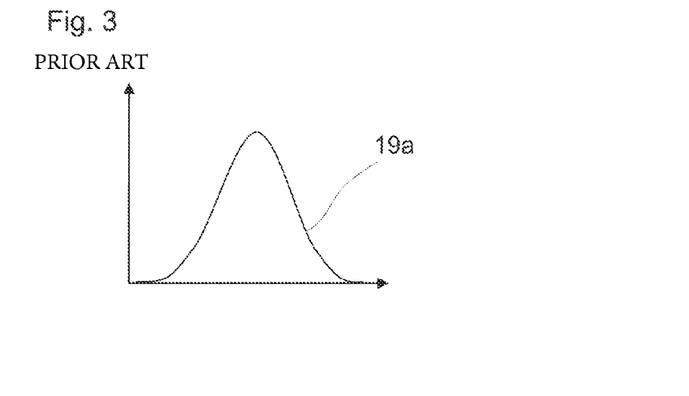
FIG. 3 the distribution of the FFL-values or a value dependent on the FFL of the lens modules.

Due to fabrication tolerances which e.g. may lead to different geometries of the lens structures, to flange focus lengths (FFL) 6a . . . d of the lens modules 2a . . . d is variable. I.e., the focal plane 27a . . . d of the lens modules 2a . . . d lies in a variable distance 6a . . . d from the lens arrangement. FIG. 3 shows a typical distribution 19a of FFL-values or values dependent on the FFL of a plurality of lens modules caused by fabrication tolerances which corresponds to a standard distribution.

Figure 4:
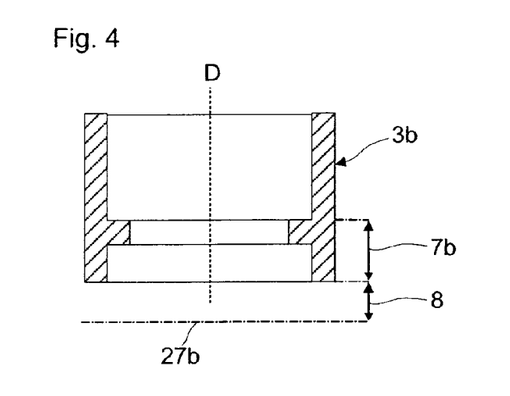
FIG. 4 a mount element.

FIG. 4 shows a first embodiment of a mount element 3b of the so called top loading type. The name "top loading type" means that the lens module 2b is inserted into the interior of the mount element 3b from above (as seen from the focal plane 27b). The mount element has a hollow circular cylindrical or cuboid shape. On the inner wall of the mount element 3b a ring-shaped protrusion is provided which constricts the inner diameter of the hollow cylinder. The ring-shaped protrusion is concentrically arranged with the hollow cylinder. The interior space of the mount element 3b accommodates the lens module 2b, wherein the mentioned protrusion forms a first contact or support surface 10 which serves as a dead stop for the lens module 2b when introduced into the interior space of the mount element 3b to form an optical device 20a (see also FIG. 6). The mount element 3b further forms a second contact surface 11 on its side facing the optoelectronic unit 4 for assembling with the optoelectronic unit 4. In present case the second contact surface 11 is a ring-shaped front end of the mount element 3b which is concentrically arranged to the hollow cylinder. Once the optical device 20a, comprising the lens module 2a and the mount element 3a, and the optoelectronic unit 4 are assembled to form a complemented optical device (see also FIG. 8), the mount element 3a . . . b is directly or indirectly supported on the optoelectronic unit 4 via the second contact surface 11. However, the complemented optical device 20a can also be formed only in the camera, when the optical device 20a and the optoelectronic unit 4 are brought together in an operative connection.

Figure 6:
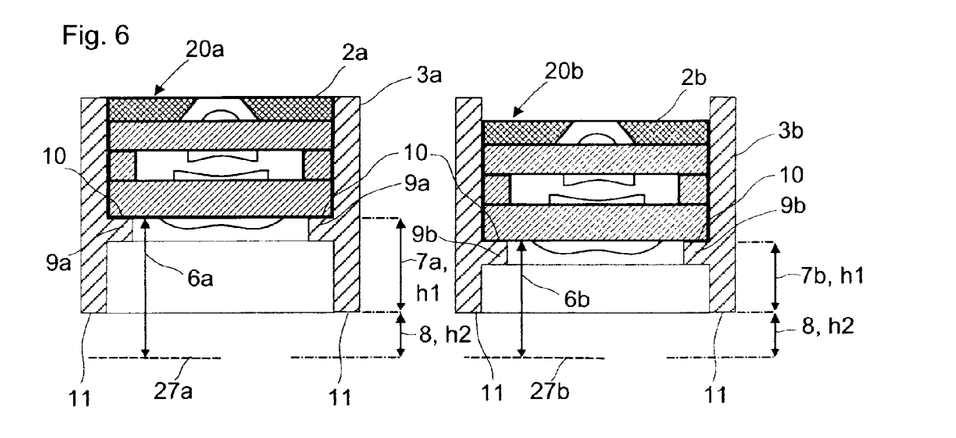
FIG. 6 a first embodiment of a set of optical devices.
Figures 7, 8:
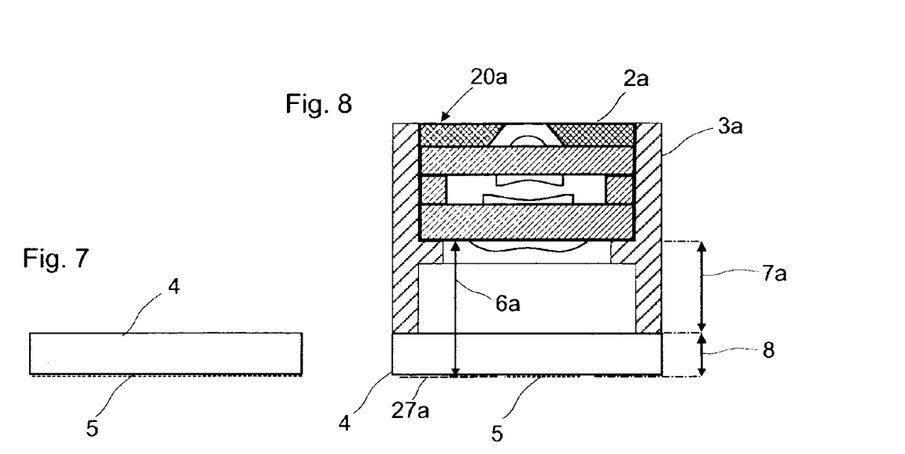
FIG. 7 an image sensor.
FIG. 8 an optical device supplemented with an optoelectronic unit.

The distance 7a . . . 7b between said second contact surface 11 and the first contact surface 10 of the protrusion corresponds to the mount FFL section h1. As shown in FIG. 6, the mount FFL section h1 of the mount elements 3a . . . b is variable and adapted to the FFL-value of the corresponding lens module 2a . . . b to compensate the variation in the FFL-values of said lens modules 2a . . . b. The variability of the mount FFL section h1 is achieved by different positions of the ring-shaped protrusion 9a . . . b along the axis D of the hollow cylindrical shaped mount element 3a . . . b. The distance 8 between the second contact surface 11 of the mount element 3a . . . b and the image sensor plane 5, resp. the focus plane 27a . . . b, also called the device FFL section h2, is constant. According to the embodiment "top loading mount" the flange focus length FFL 6a . . . b of the lens module 2a . . . d corresponds to the sum of the variable mount FFL section h1 and the constant device FFL section h2.

Figure 9:
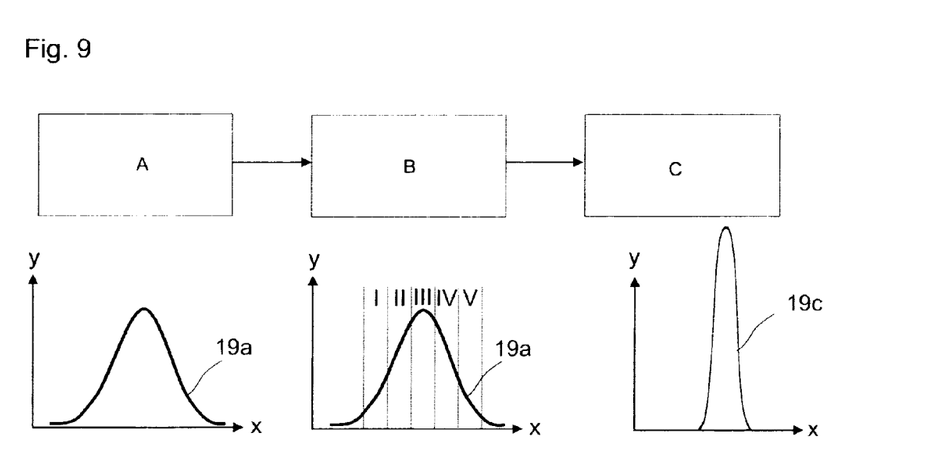
FIG. 9 the distribution of the FFL-values or a value dependent on the FFL throughout the manufacturing process according to the invention.

According to FIG. 9, in a first step A the FFL-value or a value dependent on the FFL of each lens module 2a . . . d is determined, e.g. measured. In a subsequent step B the lens modules 2a . . . d are classified according to their determined value, particularly FFL value. For this, several FFL-classes or groups, here five in total: I, II, III, IV, V, are built, wherein each FFL-class defines a value range, particularly a range of FLL-values. Each lens module 2a . . . d is now allocated to an FFL-class. Outliers can be rejected.

For each class or group mount elements of a specific design with respect to the position of the first contact surface, i.e. the protrusion, relative to the second contact surface along said axis D is provided. In step C, the lens modules of each FFL class are now assembled with the mount elements allocated to this class.

Figure 5:
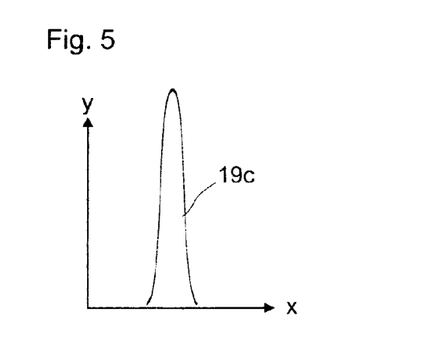
FIG. 5 the distribution of the FFL-value or a value dependent on the FFL of a defined class of lens modules.

As each FFL-class covers not only one value but a range of values, particularly FFL-values, the lens modules of an FFL-class still have variable values, particularly FFL-values. Such a distribution 19b of FFL values is shown in FIG. 9, in step B. The y-axis stands for the quantity of mount elements and the x-axis stands for the FFL-value or a value dependent on the FFL. However, the variation 19b in the FFL-values of the lens modules 2a . . . d within a class is much smaller than the overall distribution 19a, so that the focal planes of the lens modules essentially falls into the image sensor planes 5 of the image sensors 4 despite of a tolerance range. In FIGS. 5 and 9 (step C) the cumulated distribution 19c of the FFL values after classification of the lens modules is shown. As it can be seen from the graph, the variance of the FFL values is much smaller in comparison with the distribution 19a and hence the reject of lens modules due to inadmissible variation of the FFL is reduced or even eliminated.

Figure 10:
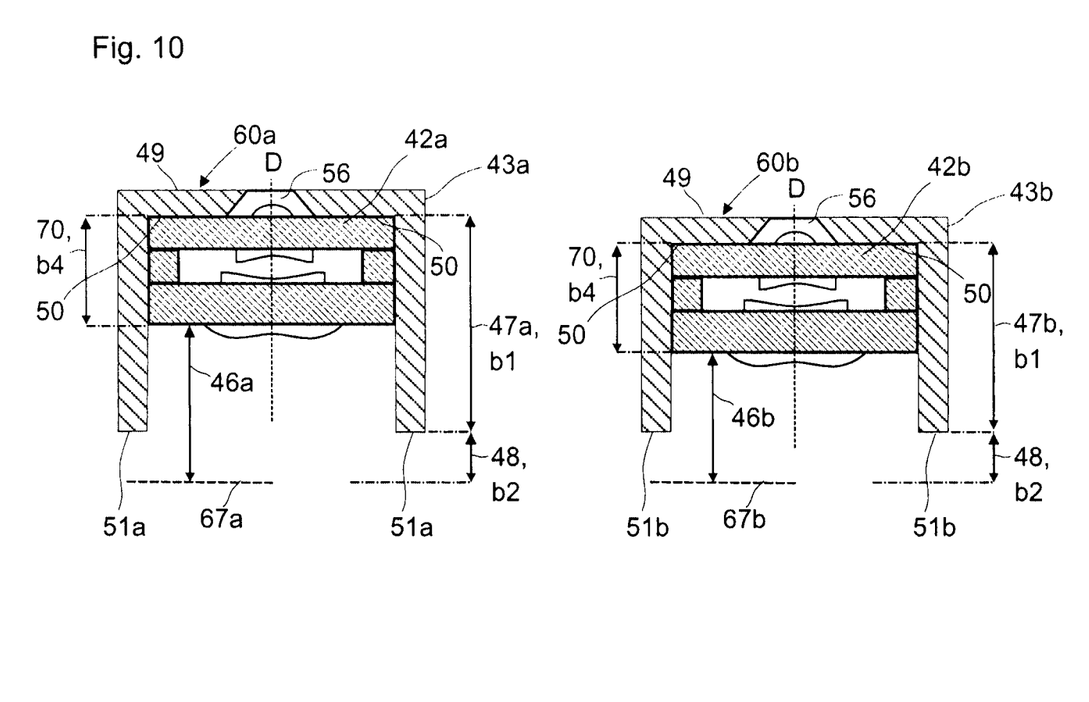
FIG. 10 a second embodiment of a set of optical devices.

FIG. 10 shows a second embodiment of a set of mount elements 43a . . . b of the so called "bottom loading type". The name "bottom loading type" means that the lens module 42a . . . b is inserted into the interior of the mount element 43a . . . b from below (as seen from the focal plane 57a . . . b). The mount element 43a . . . b has a hollow circular cylindrical or cuboid shape. On the end face of the mount element 43a . . . b lying opposite to the second contact surface 51a . . . b, the mount element 43a . . . b contains a limit stop 49, which forms the first contact surface and hence prevents the inserted lens module 42a . . . b from further moving in the direction of insertion. In present case the limit stop 49 is in the form of a cover 49 which closes the opening of the mount elements 43a . . . b, lying opposite to the second contact surface 51a . . . b. The cover 49 is designed as a screen element with an aperture 56. The aperture 56 is aligned with the lenses of the lens module 42a . . . b. The screen element with the aperture 56 is provided for blocking off stray light. However, the limit stop can also be in the form of a ring shaped protrusion on said end face of the mount element.

The interior space of the mount element 43a . . . b accommodates the lens module 42a . . . b, wherein the mentioned cover 49 forms a first contact or support surface 50 which serves as a dead stop for the lens module 42a . . . b when introduced into the interior space of the mount element 43a . . . b to form an optical device 60a . . . b. The mount element 43a . . . b further has a second contact surface 51a . . . b on its side facing the optoelectronic unit (not shown) for assembling with the optoelectronic unit. In present case the second contact surface 51a . . . b is a ring-shaped front end (circular, prismatic or any other shape) of the mount element 43a . . . b which is concentrically arranged to the hollow cylinder. Once the optical device 60a . . . b, comprising the lens module 42a . . . b and the mount element 43a . . . b, and the optoelectronic unit are assembled to form a complemented optical device 60a . . . b, the mount element 43a . . . b is directly or indirectly supported on the optoelectronic unit via the second contact surface 51. However, the complemented optical device 60a . . . b can also be formed only in the camera, when the optical device 60a . . . b and the optoelectronic unit are brought together in an operative connection.

The distance 47a . . . b between said second contact surface 51a . . . b and the first contact surface 50 of the cover 49 corresponds to the variable mount FFL section b1. As shown in FIG. 10, the mount FFL section b1 of the mount elements 43a . . . b is variable and adapted to the FFL-value of the corresponding lens module 42a . . . b to compensate the variation in the FFL-values of said lens modules 42a . . . b. The variability of the mount FFL sections b1 is achieved by a variable height of the mount elements 43a . . . b (mount length along the axis D). The distance 48 between the second contact surface 51a . . . b of the mount element 43a . . . b and the image sensor plane, resp. the focus plane 67a . . . b, also called the device FFL section b2, is constant for all optical devices 60a . . . b.

According to the embodiment "bottom loading mount" the sum of the flange focus length FFL 46a . . . b of the lens module 42a . . . d and the lens chip height 70, b4 corresponds to the sum of the variable mount FFL section 47a . . . b, h1 and the constant device FFL section 48, h2. As the height b4 of the lens chip 42a . . . b.

While the invention has been described in present preferred embodiments of the invention, it is distinctly understood that the invention is not limited thereto, but may be otherwise variously embodied and practised within the scope of the claims.

LIST OF DESIGNATIONS 1 wafer stack assembly of lens modules
2a . . . d lens modules
3a . . . b mount elements
4 optoelectronic unit with an image sensor
5 image sensor plane
6a . . . d FFL of the lens modules
7a . . . b variable mount FFL section (h1)
8 constant device FFL section (h2)
9a . . . b ring-shaped protrusion
10 first contact surface
11 second contact surface
12a . . . b screen element
13a . . . b first lens unit
14a . . . b spacer element
15a . . . b second lens unit
16a . . . b screen aperture
17a . . . b lens structures of the first lens unit
18a . . . b lens structures of the second lens unit
19a FFL distribution of all lens modules
19b FFL distribution and classification in classes I-V
19c cumulated FFL distribution after classification of the lens modules
20a . . . b optical device
22 screen wafer
23 first wafer
24 spacer wafer
25 second wafer
26a . . . b through holes
27a . . . d focal plane
42a . . . b lens modules
43a . . . b mount elements
46a . . . b FFL of the lens module (lens FFL)
47a . . . b variable mount FFL section (b1)
48 constant device FFL section (b2)
49 cover element (screen element)
50 first contact surface
51a . . . b second contact surface
56 screen aperture
60a . . . b optical device
67a . . . b focal plane
70 height of the lens chip (b4)

What is claimed is:

1. A method of manufacturing a plurality of optical devices for cameras, each optical device having a fix focus lens module and a mount element for assembling with an image sensor comprising an image sensor plane, each fix focus lens module comprising one or more lenses or lens parts, the method comprising:

manufacturing a plurality of lens modules, wherein all the lens modules are part of a same wafer or wafer stack assembly;

defining at least two classes of focusing parameter values (FP), each class of focusing parameter value(s) encompassing a lens module focusing parameter value or a range of lens module focusing parameter values, which the lens module may feature;

determining a respective lens module focusing parameter value (FP) for each lens module;

providing and allocating barrel-shaped mount elements to the lens modules, wherein the barrel-shaped mount elements are arranged to accommodate the lens modules therein and wherein the mount elements are to be arranged within the optical devices to define a fixed separation distance between the lens modules and the image sensor plane, the mount elements having variable mount section lengths by means of which the geometrical distance between the lens module and the image sensor plane is adjusted for each lens module individually or in groups dependent on the optical properties of the lens modules, to compensate the variation of the lens module focusing parameter values between the plurality of lens modules, so that the focal plane of the lens modules falls into the image plane or lies within the depth of focus of the camera containing the optical device, wherein each group of lens modules is fewer than all the lens modules on the wafer or wafer stack assembly;

wherein providing and allocating the barrel-shaped mount elements to the lens modules includes:

allocating each lens module to a class of focusing parameter value(s) based on the determined lens module focusing parameter values;

providing and allocating to each class of focusing parameter value(s) a class of mount elements with a defined mount section length depending on the lens module focusing parameter value or the range of lens module focusing parameter values of the class to which the mount elements are allocated; and allocating to each lens module of a class a mount element of this class;

the method further including assembling the lens modules and the mount elements to form optical devices.

2. The method according to claim 1, wherein the lens module focusing parameter corresponds to a flange focus length (FFL) or to a lens module parameter based on the FFL, and wherein the method comprises determining the lens module focusing parameter value by direct or indirect measuring of the FFL value or by determining of the parameter value based on the FFL of the corresponding lens modules.

3. The method according to claim 1, wherein the mount section length of the mount elements is graded in steps of 5-10 µm.

4. The method according to claim 1, wherein the lens modules have different focusing parameter values due to fabrication tolerances of a lens structure.

5. The method according to claim 1, comprising manufacturing the lens modules using replication on wafer scale.

6. The method according to claim 1, wherein the manufacturing of the lens modules comprises embossing.

7. The method according to claim 1, wherein the manufacturing of the lens modules comprises molding.

8. The method according to claim 1, further including inserting the lens modules into respective ones of the barrel-shaped mount elements.

\* \* \* \* \*